(12) United States Patent
Mandrini

(10) Patent No.: US 6,593,798 B2
(45) Date of Patent: Jul. 15, 2003

(54) VOLTAGE FOLLOWER AND RELATED METHOD OF REGULATION

(75) Inventor: Tiziana Mandrini, Mortara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/190,913

(22) Filed: Jul. 8, 2002

(65) Prior Publication Data

US 2003/0025536 A1 Feb. 6, 2003

(30) Foreign Application Priority Data

Jul. 9, 2001 (EP) .............................................. 01830457

(51) Int. Cl.$^7$ .............................................. H03K 17/60
(52) U.S. Cl. ..................... 327/482; 327/491; 327/432
(58) Field of Search ........................ 327/478, 482–492, 327/432, 433, 333, 80, 81, 87; 326/124, 126

(56) References Cited

U.S. PATENT DOCUMENTS

| 3,825,774 A | | 7/1974 | Van Kessel et al. ........ 307/260 |
| 4,593,206 A | * | 6/1986 | Neidorff et al. ............... 326/90 |
| 5,455,533 A | * | 10/1995 | Kollner ....................... 327/484 |
| 5,808,501 A | * | 9/1998 | Ivanov ........................ 327/333 |
| 6,118,327 A | * | 9/2000 | Watarai ....................... 327/562 |

FOREIGN PATENT DOCUMENTS

| EP | 0045 691 | 2/1982 | ............. H03F/3/50 |
| EP | 0394 807 | 10/1990 | ............. H03F/1/30 |

* cited by examiner

*Primary Examiner*—Toan Tran
(74) *Attorney, Agent, or Firm*—Lisa K. Jorgenson; Allen, Dyer, Doppelt, Milbrath & Gilchrist, P.A.

(57) ABSTRACT

A voltage follower includes a follower stage including first and second bipolar junction transistors connected in cascade, and a first current generator connected to the follower stage for biasing the first and second bipolar junction transistors. A cascode stage is connected between the first current generator and the first bipolar junction transistor, and a second current generator is connected between the first bipolar junction transistor and a first voltage reference. The voltage follower dissipates less power when the output current is small.

33 Claims, 2 Drawing Sheets

US 6,593,798 B2

VOLTAGE FOLLOWER AND RELATED METHOD OF REGULATION

FIELD OF THE INVENTION

The present invention relates to the field of electronics, and in particular, to a voltage follower and a corresponding method of regulating the same.

BACKGROUND OF THE INVENTION

Often in the implementation of complex electronic systems, it is not possible to connect the output of a certain stage to the input of a stage downstream in a signal path. In particular, this is not possible when the downstream stage is to be fed with a small output impedance or with a power greater than that provided by the preceding stage. Usually, in these situations, the upstream stage is coupled to the downstream stage through a voltage follower.

A voltage follower is a voltage amplifier that outputs a voltage equal to its input voltage independent of the current being absorbed by its electrical load. A typical voltage follower is schematically depicted in FIG. 1, and includes a follower stage formed by the transistors T1 and T2, which are biased by a constant current generator. The output voltage $V_{OUT}$ of the follower stage is a replica of the input voltage $V_{rif}$ and does not depend on the output current $I_{OUT}$ circulating in the transistor T2. The voltage follower is generally formed using BJT technology because of its simplicity, and because of the good tracking between input and output voltages that can be ensured.

The current generator generates a bias current I such that the transistor T2 may output the desired maximum current $I_{OUT,MAX}$ to the load. Since $\beta_{min}$ is the minimum gain of the transistor T2, the following relationship must hold:

$$I = I_{OUT,MAX}/\beta_{min} \quad (1)$$

The current circulating in the transistor T1 ranges from a minimum value when the transistor T2 outputs the maximum current $I_{OUT,MAX}$, up to a maximum value I when the output current $I_{OUT}$ is null.

A current almost equal to I circulates in the transistor T1 as long as a relatively small current $I_{OUT}$ circulates in the transistor T2. Therefore, the transistor T1 must be properly dimensioned to have a substantially constant base-emitter gain even when the current circulating in it becomes relatively large.

The circuit of FIG. 1 is not very efficient when a relatively small current is being supplied to the load. The power provided by the supply $P_s$ is:

$$P_s = Vcc \cdot I + Vcc \cdot I_{OUT} = Vcc \cdot [(I_{OUT,MAX}/\beta_{min}) + I_{OUT}] \quad (2)$$

and the power delivered to the load is:

$$P_{LOAD} = V_{OUT} \cdot I_{OUT} \quad (3)$$

Therefore, the power dissipation is:

$$P_{DISS} = P_s - P_{LOAD} = Vcc \cdot [(I_{OUT,MAX}/\beta_{min}) + I_{OUT}] - V_{OUT} \cdot I_{OUT} \quad (4)$$

The power dissipation of the voltage follower of FIG. 1 becomes relatively large when $I_{OUT}$ is relatively small, as it may be easily inferred from equation (4). Thus, there is a need for a voltage follower capable of delivering to a load a current $I_{OUT}$ that may assume a certain maximum value $I_{OUT,MAX}$, while dissipating a significantly reduced power when $I_{OUT}$ becomes relatively small.

SUMMARY OF THE INVENTION

In view of the foregoing background, an object of the present invention is to provide a voltage follower that is efficient for driving a load that generally absorbs a relatively small current and only occasionally a relatively large current.

The voltage follower according to the present invention dissipates less power than the voltage followers of the prior art as long as it delivers a relatively small output current. This is because the follower stage of the voltage follower is biased by a current that is progressively reduced as the output current delivered to the load decreases. According to one embodiment, the voltage follower comprises a follower stage formed by a pair of bipolar junction transistors, electrically in cascade, and commonly biased by a current generator.

The voltage follower dissipates a relatively reduced power when the output current is small because it comprises a second current generator. The second current generator is connected between the current node of the input transistor of the voltage follower and a common potential node of the stage. The first bias current generator is in the form of a current mirror. A diode connected transistor of the current mirror is coupled through a cascode stage to the current node of the first transistor connected to the second current generator.

Another aspect of the present invention is directed to a method of regulating a voltage follower driving a load. The voltage follower comprises a follower stage composed of a pair of bipolar junction transistors in cascade, and which are biased by an adjustable current generator. The method comprises progressively increasing or decreasing the bias current provided by the adjustable current generator as a function of a feedback signal representing the current that the output transistor of the pair of transistors delivers to the load.

BRIEF DESCRIPTION OF THE DRAWINGS

The different aspects and advantages of the invention will become even more evident through a detailed description of several embodiments and by referring to the attached drawings, wherein.

DETAILED DESCRIPTION OF THE PREFERRED EMBODIMENTS

Figure 1:
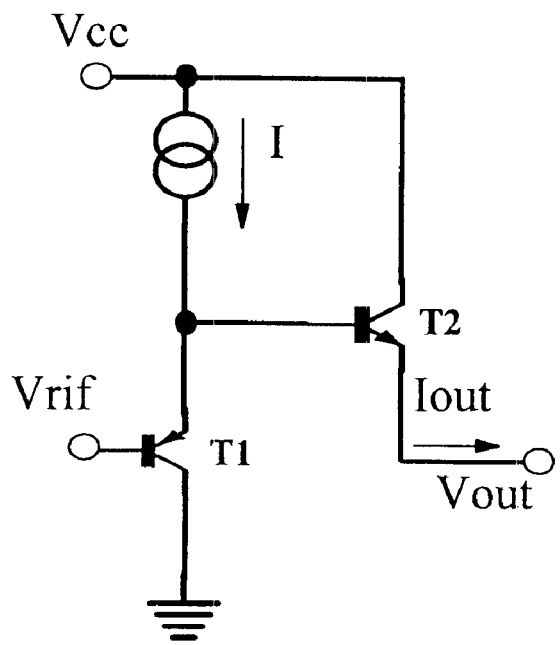
FIG. 1 is a schematic diagram of a typical voltage follower according to the prior art.

Prior art voltage followers, such as the one depicted in FIG. 1, dissipate a non-negligible power when the output current $I_{OUT}$ becomes relatively small. This is so because the bias current of the follower stage is excessively large in this type of operating condition. Such a large bias current is necessary to allow the transistor T2 to provide for the desired maximum current $I_{OUT,MAX}$ to the load.

All the time the load absorbs a relatively small current $I_{OUT}$. Only a small part of the bias current is absorbed by the base of the output transistor T2 while the remaining part circulates in the transistor T1 dissipating power. This power dissipation is reduced by a method in accordance with the present invention for regulating a voltage follower.

The follower stage is biased with an adjustable current generator for varying the generated current as a function of the output current $I_{OUT}$. To this end, a feedback signal $I_d$ representative of the current $I_{OUT}$ being delivered to the load is used for increasing or decreasing the generated current as the current $I_{OUT}$ increases or decreases, respectively.

Figure 2:
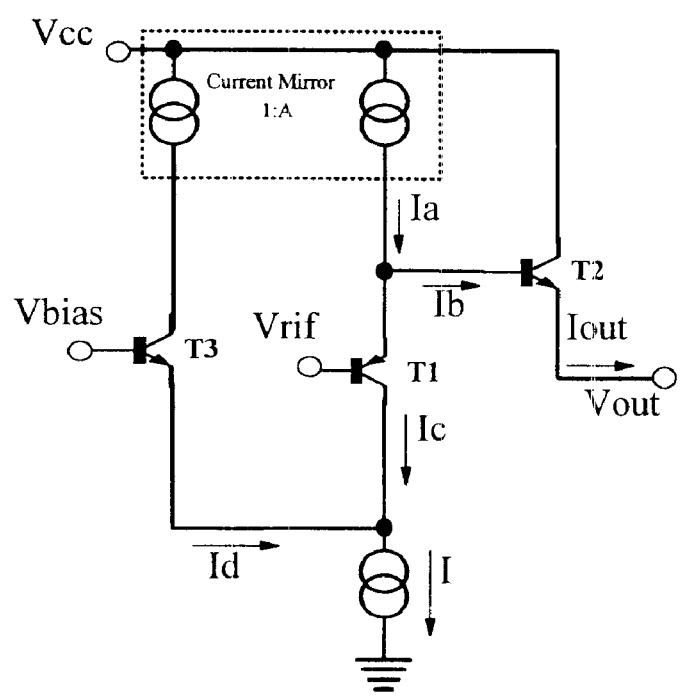
FIG. 2 is a schematic diagram of a voltage follower according to the present invention.

The method of the invention may be easily implemented using a voltage follower as depicted in FIG. 2. The voltage follower in accordance with the present invention has a follower stage composed of a pair of bipolar junction transistors T1, T2 electrically in cascade, and a current generator formed by a current mirror CURRENT_MIRROR. THE current mirror CURRENT_MIRROR has a certain mirror ratio A that biases the follower stage with a current $I_a$.

The characterizing feature of the circuit of the invention is based upon the fact that it includes a cascode stage T3 forming a feedback line, and a second current generator of a constant current I connected between the input transistor of the follower stage and a common potential node of the circuit. Accordingly, the bias current $I_a$ that is generated by the current mirror may be varied as a function of the output current $I_{OUT}$ being delivered to the load.

When the output current $I_{OUT}$ decreases, the base current $I_b$ absorbed by the output transistor T2 decreases and thus the current $I_c$ circulating in the transistor T1 increases. As $I_c$ increases, the feedback current $I_d$ that circulates in the diode connected transistor of the current mirror CURRENT_MIRROR decreases, thus reducing the generated biasing current $I_a$.

The constant current I generated by the added second current generator, and the mirror ratio A of the circuit of FIG. 2 may be designed as follows. The adjustable current generator CURRENT_MIRROR must be capable of outputting a maximum bias current $I_{a,MAX}$ sufficient to let the transistor T2 output the desired maximum current $I_{OUT,MAX}$ to the load. Since $\beta_{min}$ is the minimum gain of the transistor T2

$$I_{a,MAX} = I_{OUT,MAX}/\beta_{min} \quad (5)$$

When the transistor T2 outputs the maximum current $T_{OUT,MAX}$ to the load, a negligible current circulates in the transistor T1. In practice, the maximum feedback current $I_{d,MAX}$ is substantially equal to the constant current I generated by the second current generator:

$$I_{d,MAX} = I \quad (6)$$

The feedback current circulates in the input diode connected transistor of the current mirror CURRENT_MIRROR through a cascode stage T3 made of a transistor biased in a conduction state by a bias voltage $V_{BIAS}$. When the feedback current assumes its maximum value, the follower stage T1, T2 is biased with a current $I_{a,MAX}$ given by:

$$I_{a,MAX} = A \cdot I_{d,MAX} = A \cdot I \quad (7)$$

According to equations (5) and (7), the constant current I and the mirror ratio A satisfy the following condition:

$$A \cdot I = I_{OUT,MAX}/\beta_{min} \quad (8)$$

Through simple considerations it is possible to demonstrate that the current $I_c$ circulating in the transistor T1 is always smaller than the constant current I:

$$I_c < I = I_{OUT,MAX}/(A \cdot \beta_{min}) \quad (9)$$

Equation (9) implies that, when the voltage follower of the invention is delivering a relatively small current to the load, the current $I_c$ that circulates in the transistor T1 is A times smaller than the current that circulates in the prior art voltage follower of FIG. 1, under the same operating condition. This allows a reduction in the size of the transistor T1, because the transistor T1 is crossed by relatively reduced currents, thus providing for a reduction in the occupied silicon area.

A second relation between the design parameters A and I for calculating their values may be obtained by comparing the power dissipated by the voltage follower of the invention with the power dissipated by the prior art voltage follower of FIG. 1 that is given by equation (4). Since $\beta$ is the base-emitter gain of the transistor T2, for the first Kirchhoff's law $$I_a = T_b + I_c = I_{OUT}/\beta + I - I_d \quad (10)$$

Combining equations (8) and (10)

$$I_a + I_d = I_{OUT}/\beta + I_{OUT,MAX}/(A \cdot \beta_{min}) \quad (11)$$

The power $P^*_s$ provided by the power supply of the voltage follower of the invention is:

$$P^*_s = Vcc \cdot (I_a + I_d + I_{OUT}) = Vcc \cdot [I_{OUT}/\beta + I_{OUT,MAX}/(A \cdot \beta_{min}) + I_{OUT}] \quad (12)$$

The power output to the load is $$P^*_{LOAD} = V_{OUT} \cdot I_{OUT} \quad (13)$$

thus the power dissipation is $$P^*_{DISS} = P^*_s - P^*_{LOAD} = Vcc \cdot [I_{OUT}/\beta + I_{OUT,MAX}/(A \cdot \beta_{min}) + I_{OUT}] - V_{OUT} \cdot I_{OUT} \quad (14)$$

For the same current $I_{OUT}$ circulating in the load, the power dissipation of the voltage follower of the invention shown in FIG. 2 may be reduced by increasing the mirror ratio A.

To make the power dissipation of the voltage follower of the invention smaller than the power dissipation of the prior art voltage follower of FIG. 1 for a certain output current $I_{OUT}$, the mirror ratio A must satisfy the following relation:

$$Vcc \cdot [I_{OUT}/\beta + I_{OUT,MAX}/(A \cdot \beta_{min}) + I_{OUT}] - V_{OUT} \cdot I_{OUT} < Vcc \cdot [(I_{OUT,MAX}/\beta_{min}) + I_{OUT}] - V_{OUT} \cdot I_{OUT} \quad (15)$$

and thus $$A > \beta \cdot I_{OUT,MAX}/(\beta \cdot I_{OUT,MAX} - \beta_{min} \cdot I_{OUT}) \quad (16)$$

The voltage follower of the invention is particularly more advantageous than prior art voltage followers when normally a relatively small output current is absorbed by the load, and only occasionally the transistor T2 is required to output a relatively large current. In this case, the current mirror CURRENT_MIRROR may be designed to have a mirror ratio A that satisfies equation (16) as long as the output current $I_{OUT}$ remains below a pre-established level higher than that of the current that is normally delivered to the load.

Figure 3:
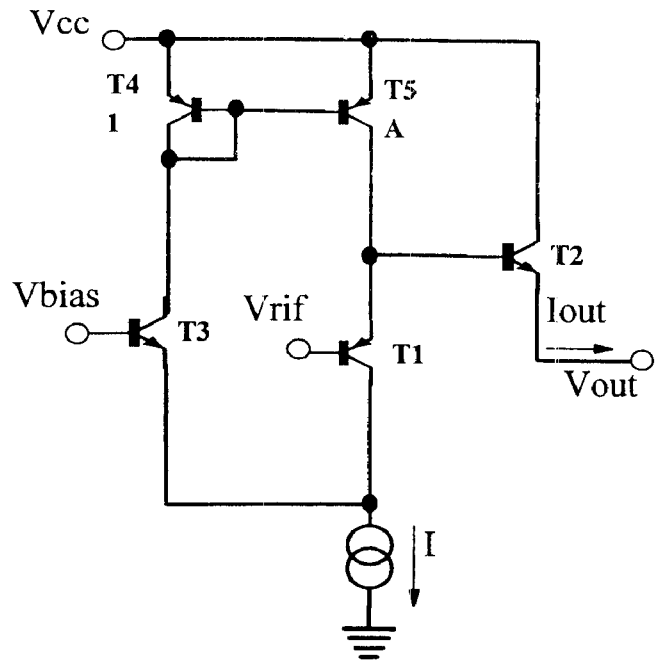
FIGS. 3 and 4 are schematic diagrams respectively illustrating the voltage follower of FIG. 2 in BJT and BCD technology.
Figure 4:
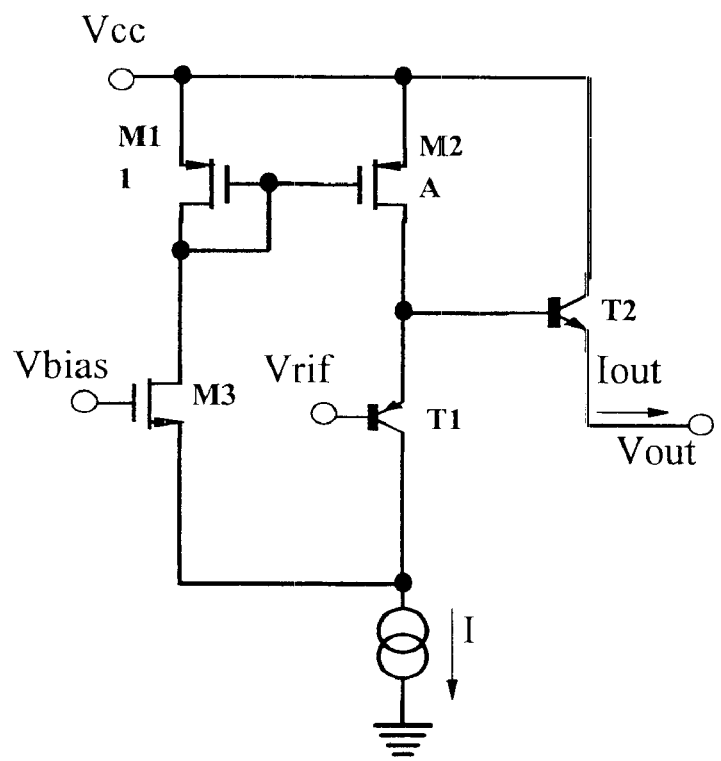

The voltage follower of the invention may be conveniently formed either in BJT technology, as shown in FIG. 3, as well as in BCD technology. In the latter case, both the cascode stage and the current mirror are made with MOS transistors, as shown in FIG. 4.

That which is claimed is:

1. A method for regulating a voltage follower connected to a load and comprising a follower stage including first and second bipolar junction transistors connected in cascade; a first current generator connected to the follower stage for biasing the first and second bipolar junction transistors; a cascode stage connected between the first current generator and the first bipolar junction transistor; and a second current generator connected between the first bipolar junction transistor and a first voltage reference, the method comprising:

provided a bias current from the first current generator to the first and second bipolar junction transistors;

providing a load current from the second bipolar junction transistor to the load;

providing a feedback current via the cascode stage that is representative of the load current; and changing the bias current as a function of the feedback current as the load current changes.

2. A method according to claim 1, wherein changing the bias current comprises increasing the bias current as the load current increases.

3. A method according to claim 1, wherein changing the bias current comprises decreasing the bias current as the load current decreases.

4. A method according to claim 1, wherein providing the feedback current is based upon a difference between a pre-established constant current provided by the second current generator and a current provided by the first bipolar junction transistor.

5. A method according to claim 1, wherein the first current generator comprises a current mirror including at least one diode-connected transistor.

6. A method according to claim 1, wherein the first bipolar junction transistor has a first type of conductivity, and the second bipolar junction transistor has a second type of conductivity.

7. A method according to claim 5, wherein the second current generator generates a constant current greater than or equal to a ratio between a maximum current to be delivered to the load, and a first product between a minimum gain of the second bipolar junction transistor and a current mirror ratio.

8. A method according to claim 7, wherein the current mirror ratio is greater than a ratio between:

a second product between a gain of the second bipolar junction transistor when delivering a pre-established current to the load, and the maximum current to be delivered to the load; and a difference between the second product and a third product between the minimum gain of the second bipolar junction transistor and the pre-established current being delivered to the load.

9. A method according to claim 1, wherein the cascode stage comprises a transistor biased in a conduction state.

10. A method according to claim 5, wherein the at least one diode-connected transistor in the current mirror comprises a first MOS transistor; and wherein the cascode stage comprises a second MOS transistor.

11. A method according to claim 5, wherein the at least one diode-connected transistor in the current mirror comprises a third bipolar junction transistor; and wherein the cascode stage comprises a fourth bipolar junction transistor.

12. A voltage follower comprising:

a follower stage comprising first and second bipolar junction transistors connected in cascade;

a first current generator connected to said follower stage for biasing said first and second bipolar junction transistors;

a cascode stage receiving a bias signal and being connected between said first current generator and said first bipolar junction transistor; and a second current generator connected between said first bipolar junction transistor and a first voltage reference.

13. A voltage follower according to claim 12, wherein said first current generator comprises a current mirror including at least one diode-connected transistor.

14. A voltage follower according to claim 12, wherein said first bipolar junction transistor has a first type of conductivity, and said second bipolar junction transistor has a second type of conductivity.

15. A voltage follower according to claim 13, wherein said second current generator generates a constant current greater than or equal to a ratio between a maximum current to be delivered to a load, and a first product between a minimum gain of said second bipolar junction transistor and a current mirror ratio.

16. A voltage follower according to claim 15, wherein the current mirror ratio is greater than a ratio between:

a second product between a gain of said second bipolar junction transistor when delivering a pre-established current to the load, and the maximum current to be delivered to the load; and a difference between the second product, and a third product between the minimum gain of said second bipolar junction transistor and the pre-established current being delivered to the load.

17. A voltage follower according to claim 12, wherein said cascode stage comprises a transistor biased in a conduction state.

18. A voltage follower according to claim 13, wherein said at least one diode-connected transistor in said current mirror comprises a first MOS transistor; and wherein said cascode stage comprises a second MOS transistor.

19. A voltage follower according to claim 13, wherein said at least one diode-connected transistor in said current mirror comprises a third bipolar junction transistor; and wherein said cascode stage comprises a fourth bipolar junction transistor.

20. A voltage follower comprising:

a first bipolar junction transistor having a first type of conductivity and including a base, a collector and an emitter;

a second bipolar junction transistor having a second type of conductivity and including a base connected to the emitter of said first bipolar junction transistor, a collector and an emitter to be connected to a load;

a first current generator for biasing said first and second bipolar junction transistors, said first current generator being connected in common to the emitter of said first bipolar junction transistor and to the base of said second bipolar junction transistor, and being connected to the collector of said second bipolar junction transistor;

a third bipolar junction transistor including a base, a collector connected to said first current generator and an emitter connected to the collector of said first bipolar junction transistor; and a second current generator connected between the collector of said first bipolar junction transistor and a first voltage reference.

21. A voltage follower according to claim 20, wherein said first and second bipolar junction transistors are connected in cascade.

22. A voltage follower according to claim 20, wherein said first current generator comprises a current mirror; and wherein said second current generator generates a constant current greater than or equal to a ratio between a maximum current to be delivered to the load, and a first product between a minimum gain of said second bipolar junction transistor and a current mirror ratio.

23. A voltage follower according to claim 22, wherein the current mirror ratio is greater than a ratio between:
- a second product between a gain of said second bipolar junction transistor when delivering a pre-established current to the load, and the maximum current to be delivered to the load; and
- a difference between the second product, and a third product between the minimum gain of said second bipolar junction transistor and the pre-established current being delivered to the load.

24. A voltage follower according to claim 20, wherein said third bipolar junction transistor is conducting when a bias voltage is applied to the base thereof.

25. A voltage follower according to claim 20, wherein said first current generator comprises at least one diode-connected bipolar junction transistor.

26. A voltage follower according to claim 20, wherein said third bipolar junction transistor is configured as a cascode stage.

27. A voltage follower comprising:
- a first bipolar junction transistor having a first type of conductivity and including a base, a collector and an emitter;
- a second bipolar junction transistor having a second type of conductivity and including a base connected to the emitter of said first bipolar junction transistor, a collector and an emitter to be connected to a load;
- a first current generator for biasing said first and second bipolar junction transistors, said first current generator being connected in common to the emitter of said first bipolar junction transistor and to the base of said second bipolar junction transistor, and being connected to the collector of said second bipolar junction transistor;
- a first MOS transistor including a gate, a drain connected to said first current generator and a source connected to the collector of said first bipolar junction transistor; and
- a second current generator connected between the collector of said first bipolar junction transistor and a first voltage reference.

28. A voltage follower according to claim 27, wherein said first and second bipolar junction transistors are connected in cascade.

29. A voltage follower according to claim 27, wherein said first current generator comprises a current mirror; and wherein said second current generator generates a constant current greater than or equal to a ratio between a maximum current to be delivered to the load, and a first product between a minimum gain of said second bipolar junction transistor and a current mirror ratio.

30. A voltage follower according to claim 29, wherein the current mirror ratio is greater than a ratio between:
- a second product between a gain of said second bipolar junction transistor when delivering a pre-established current to the load, and the maximum current to be delivered to the load; and
- a difference between the second product, and a third product between the minimum gain of said second bipolar junction transistor and the pre-established current being delivered to the load.

31. A voltage follower according to claim 27, wherein said first MOS transistor is conducting when a bias voltage is applied to the gate thereof.

32. A voltage follower according to claim 27, wherein said first current generator comprises at least one diode-connected second MOS transistor.

33. A voltage follower according to claim 27, wherein said first MOS transistor is configured as a cascode stage.

* * * * *